(12) United States Patent
Betawar et al.

(10) Patent No.: US 7,478,305 B2
(45) Date of Patent: Jan. 13, 2009

(54) METHOD AND APPARATUS FOR INTERACTIVE GENERATION OF DEVICE RESPONSE TEMPLATES AND ANALYSIS

(75) Inventors: Manoj Betawar, Fremont, CA (US); Dinesh Goradia, Fremont, CA (US)

(73) Assignee: Sapphire Infotech, Inc., Fremont, CA (US)

( * ) Notice: Subject to any disclaimer, the term of this patent is extended or adjusted under 35 U.S.C. 154(b) by 347 days.

(21) Appl. No.: 11/277,614

(22) Filed: Mar. 27, 2006

(65) Prior Publication Data

US 2007/0245198 A1    Oct. 18, 2007

(51) Int. Cl.
*G01R 31/28*    (2006.01)
*G06F 11/00*    (2006.01)

(52) U.S. Cl. .................................................... 714/742
(58) Field of Classification Search ................. 714/724, 714/742
See application file for complete search history.

(56) References Cited

U.S. PATENT DOCUMENTS

| | | | |
|---|---|---|---|
| 5,854,889 A | 12/1998 | Liese et al. | |
| 6,158,031 A | 12/2000 | Mack et al. | |
| 6,654,911 B1 | 11/2003 | Miles | |
| 6,892,154 B1 | 5/2005 | Lee | |
| 7,010,782 B2 | 3/2006 | Narayan et al. | |
| 7,055,138 B2 * | 5/2006 | Sutton | 717/125 |
| 7,237,161 B2 * | 6/2007 | Volz | 714/724 |
| 7,284,177 B2 * | 10/2007 | Hollander et al. | 714/739 |
| 2002/0162059 A1 * | 10/2002 | McNeely et al. | 714/703 |
| 2003/0208616 A1 | 11/2003 | Laing et al. | |
| 2004/0073890 A1 | 4/2004 | Johnson et al. | |
| 2004/0205406 A1 | 10/2004 | Kallappan et al. | |
| 2007/0208984 A1 * | 9/2007 | Hayhow et al. | 714/742 |
| 2007/0220392 A1 | 9/2007 | Bhaumik et al. | |

* cited by examiner

*Primary Examiner*—James C Kerveros
(74) *Attorney, Agent, or Firm*—Oblon, Spivak, McClelland, Maier & Neustadt, P.C.

(57) ABSTRACT

A device response template generator software program includes an interactive graphical-user-interface (GUI) for sending commands to devices under test and to capture and display the command responses. The GUI allows patternization of the command response to that the information contained in the response can be read, in the form of variable values, automatically, during subsequent execution of the commands by the same device or a group of devices. These values of the variables may be analyzed and may also be sent to other running testing scenarios.

15 Claims, 21 Drawing Sheets

FIG. 1 – (Prior Art)

```
[nlCapability Codes: R – Router, T-Trans Bridge, B – Source Route Bridge
[nl            S – Switch, H – Host, I – IGMP, r – Repeater
[nl
[nlDevice ID      Local Intrfce   Holdtme   Capability Platform  Port ID
[nlTerminalServer2 Fas 0/1         176        R         2511     Eth 0
[nltgw-3640-2.cisco.Fas 0/1        140        R S I     Cisco 3640Fas 3/0
[nlJAB033303JN    Fas 0/1          128        T S       WS-C2948 2/1
[nlogw-3640-1     Fas 0/1          165        R         3640     Fas 0/0
[nlsingapore#
```

```xml
<A>
    <Version>1.5.2.0</Version>
    <DataType>ASCIIScreen</DataType>
    <BList>
        <B>
            <Id>Prompt</Id>
            <stIdx>1164</stIdx>
            <enIdx>1173</enIdx>
        </B>
        <B>
            <Id>FreeFormat</Id>
            <stIdx>1</stIdx>
            <enIdx>1163</enIdx>
        </B>
    </BList>
    <MList>
        <M>
        <stIdx>1</stIdx>
        <enIdx>21</enIdx>
        </M>
    </MList>
    <VList>
        <V>
            <Id>int_status</Id>
            <stIdx>20</stIdx>
            <enIdx>21</enIdx>
            <DType>String</DType>
        </V>
        ,<V>
            <Id> macaddress</Id>
            <stIdx>85</stIdx>
            <enIdx>99</enIdx>
            <DType>String</DType>
        </V>
        <V>
            <Id>pktinput</Id>
            <stIdx>670</stIdx>
            <enIdx>675</enIdx>
            <DType>String</DType>
        </V>
    </VList>
</A>
```

FIG. 7

| Vlan | Virtual MAC-Address(es) |
| --- | --- |
| 1 | 00-00-0c-07-ac-01 |
| 10 | 00-00-0c-07-ac-02 |
| 20 | 00-00-0c-07-ac-03 |

METHOD AND APPARATUS FOR INTERACTIVE GENERATION OF DEVICE RESPONSE TEMPLATES AND ANALYSIS

BACKGROUND OF INVENTION

1. Field of the Invention

This invention relates generally to the field of testing, provisioning, maintenance and management of a network system, device or a solution. More particularly, the invention relates to the generation of device response templates, so that during a test or communication with a device, a value associated with the device, or a network system can be extracted from the device response and used in later parts of the test or communication sequence.

2. Background and Description of the Related Art

In executing a test or a communication sequence, a device or a network system can respond with information that is useful for subsequent test or communication steps. Some of it is static in nature, such as its physical identification characteristics. Some of it is dynamic in nature, such as status information about processing results or configuration settings. It is desirable to use this information as input for later test steps, rather than having to manually query the device to update the test cases prior to execution. In order to capture this information, one must analyze device responses to selected commands. These results are not necessarily in a standard format. In the current art of testing, this requires one to either write specialized software to find the patterns in the returned data and transform it into useful variables, or to manually update test sequences. Neither one is a desirable result, as it prevents tests from being automated.

In the prior art, as illustrated in FIG. 1, one would manually step through a test sequence until reaching the desired step 101. he step would then be executed 102, and the resulting information captured on the users display 103. The user would then manually calculate the position of the data value in the response 104, and write customized code 105, which can then be inserted and integrated into a test script 106.

What is desired is an apparatus to enable a test engineer to generate information the test processor can use to recognize values it needs from command responses and to provide this information as specified for the test. These values can then be used in later test steps without having to rewrite the test every time a new device is introduced. Some of these values are known variables of the Device Under Test (DUT), while other values are based on device status and in fact might consist of a sequence of data, table of data, binary values, or encoded representation of the data.

BRIEF DESCRIPTION OF THE DRAWINGS

A better understanding of the present invention can be obtained from the following detailed description in conjunction with the following drawings, in which:

FIG. 6 illustrates an example of a captured command response.

FIG. 7 illustrates an example of a template stored as XML.

FIG. 18 shows an example of a line table being selected.

The figures are provided in order to provide a thorough understanding of the present invention. The figures should not be construed as limiting the breath of the invention in any manner.

DETAILED DESCRIPTION

The term device under test (DUT) describes either a single device of a group of devices coupled together.

It may be noted that the use of the invention is not limited to a use in the testing of the devices. The word "test" as used in this document means that a command is being sent to the device or the network system and a response is received. The purpose of such sending the command and receiving the response could be either testing the device or the network system or simply for eliciting certain variable values from the device or the network system for the purpose of provisioning, maintenance, or management. Further, word "DUT" is being used in this document illustrates a device or network system.

In this invention, one of the goal is to provide a test designer a way of defining references to values contained in the response without having to write code and rebuild the test every time it is changed. The template can be used to generate a list of header information to enable a software program to determine whether the response from the device is valid, one or more markers which are a fixed string within the response that can be used to find values within a block of text, a list of blocks of a specific structure, and a list of variables contained in those blocks of a specific type. Multiple templates can be defined for a given a given command response, based on the blocks and variables defined. A test developer can then use a specific template to extract values from the response to a command and use those values in subsequent test steps.

Figure 1:
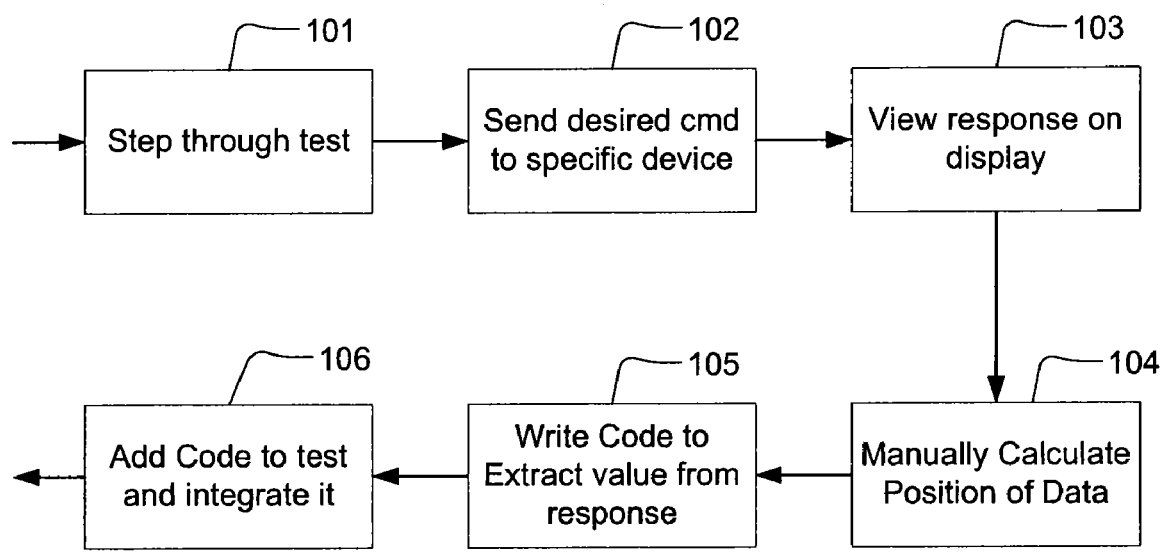
FIG. 1 illustrates the process of adding variables from test results into a test in the prior art.
Figure 2:
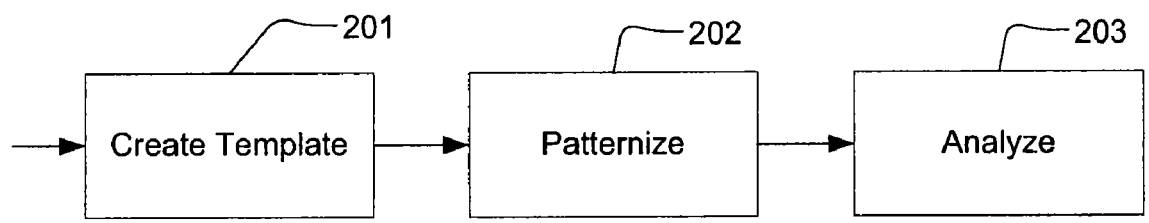
FIG. 2 illustrates the general process by which the device template is created and executed.

The process for using a template can be broken into three modes of operation as shown in FIG. 2. First, in the create template mode, the test developer creates the template by designating the device and command, then setting up a command to send to a device 201. The developer can then take the captured response and use it in the patternize mode 202, in which the developer identifies patterns in the data that can be used to extract the values of interest. Finally, once the template patters have been identified and the template has been saved, a template can be used in the analysis mode 203 to extract values in a live test sequence for use in later test steps. In the following paragraphs, we will look at each of these models of operation in more detail.

Figure 3:
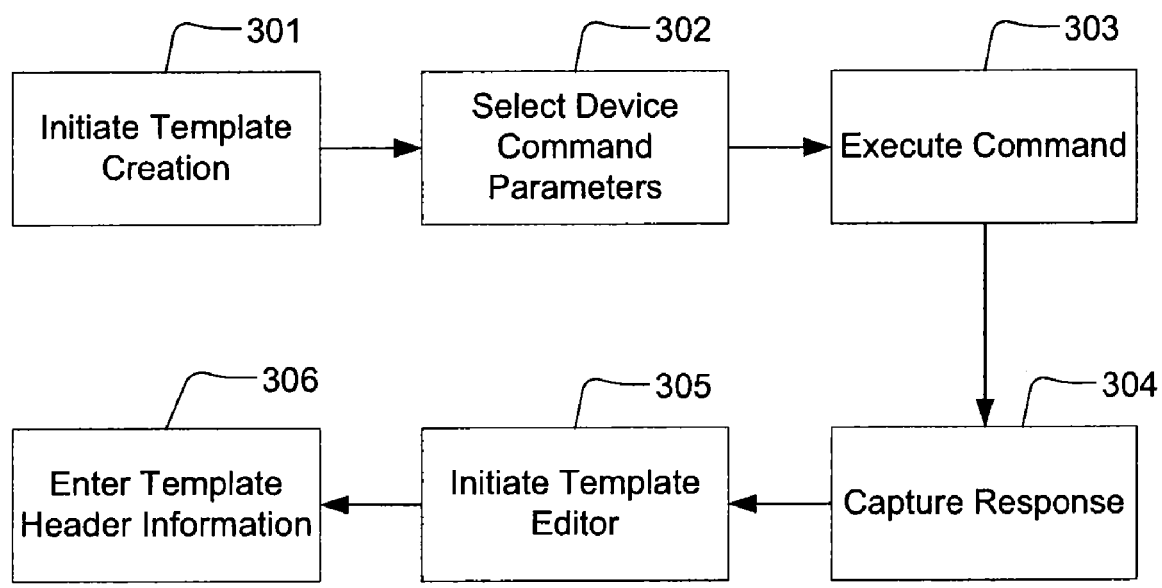
FIG. 3 illustrates the process by which the device template is created.
Figure 8:
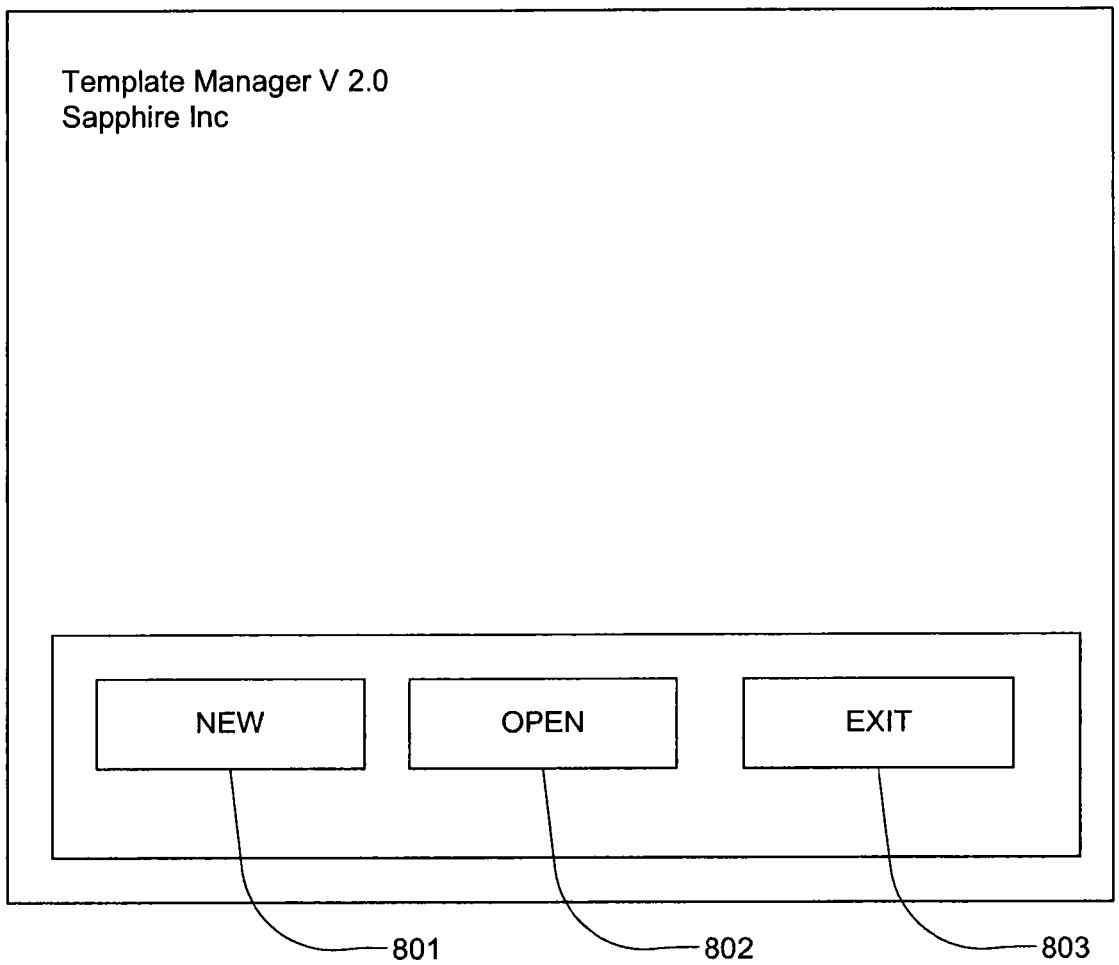
FIG. 8 illustrates an example of the program startup display.

The sequence for template creation is shown in FIG. 3. A test developer makes a choice in a computer program to initiate a template 301. At that point, he is prompted to send a command to a device 302. After the command is executed 303, the response to the command is captured 304 and displayed to the test developer in a template editor 305. An implementation of the template editor is shown in FIG. 8. Once the initial template display is presented, the test developer can enter the appropriate header information in order to identify the template such as a name for the template and type of data (ASCII or binary for example) 306.

Figure 4:
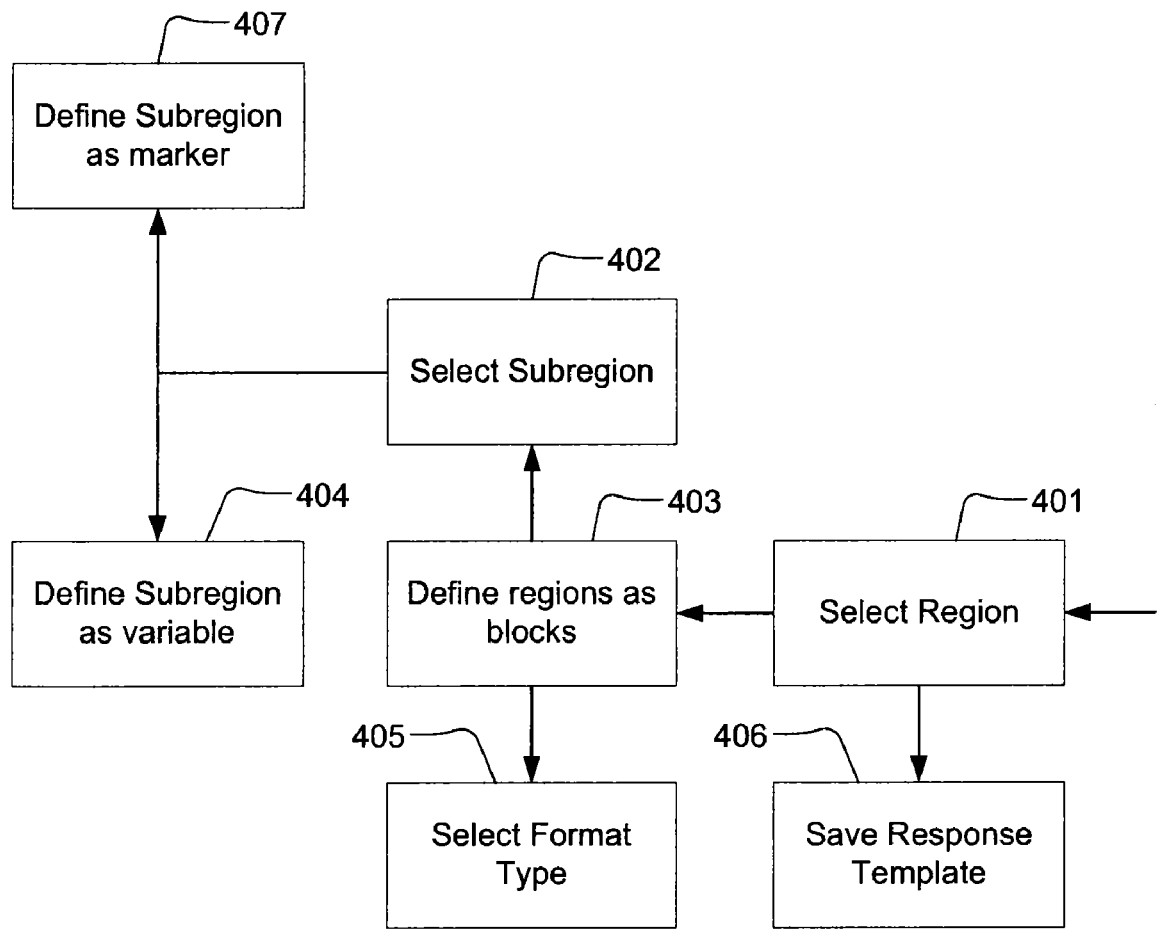
FIG. 4 illustrates the process by which the user enables the device template to find the variables, a process we refer to as patternization.

The test developer may then enter into the patternize mode, as shown in FIG. 4. The test developer may then select regions of the response 401 with an appropriate pointer device and designate them as blocks 403. The type of block may be designated once it is selected 405, such as command, prompt, or free format, or any other block type which is defined in the program. Regions within those blocks may then be selected using the same pointing device 402 and designate those subregions either as block 403, markers 407 or variables 404. Once the template definition is complete, it is stored for later use 406.

Figure 5:
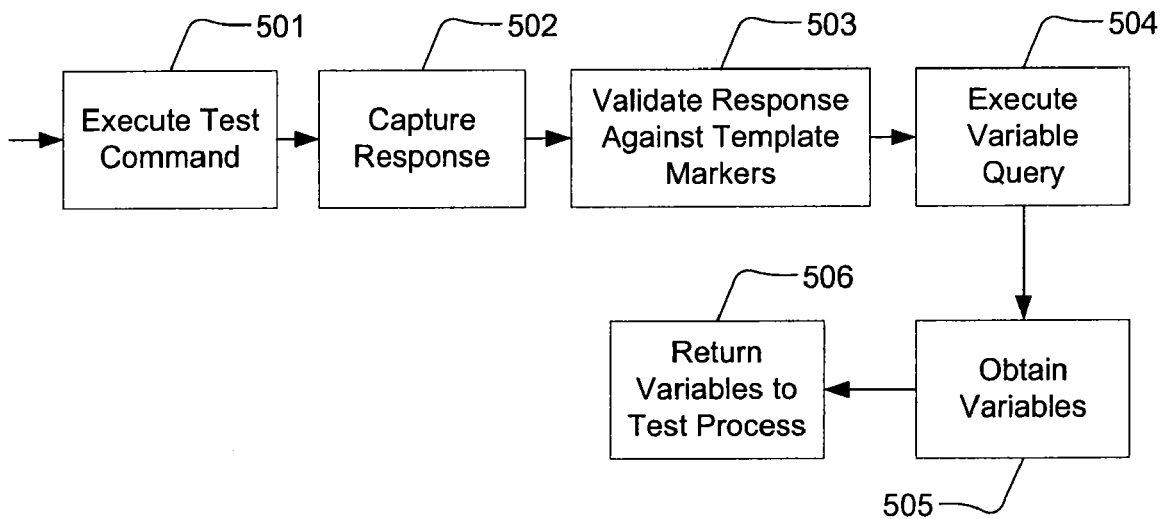
FIG. 5 illustrates the process by which the template is used by the test step to obtain the variables.

In analysis mode, a test developer may select a template to be used in a test step on receipt of the same or similar device response. As shown in FIG 5, after the matching test command is executed 501, the response is captured 502 and the template software will execute a validation step 503, comparing any strings the test developer designated to the content of the response to validate that it is the expected response. Once it does that, it will execute a search for variables associated with the template 504. It does this by searching for a string pattern in the response via a regular expression or other pattern matching algorithms to align itself and find a block which contains one or more variables, then it will find the value for one or more selected variables 505. The variables are then returned to the test software for use in later steps 506.

Described below is a system and method for interactively generating device response templates. Throughout the description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the present invention.

Interactive Device Response Template Generator

Figure 20:
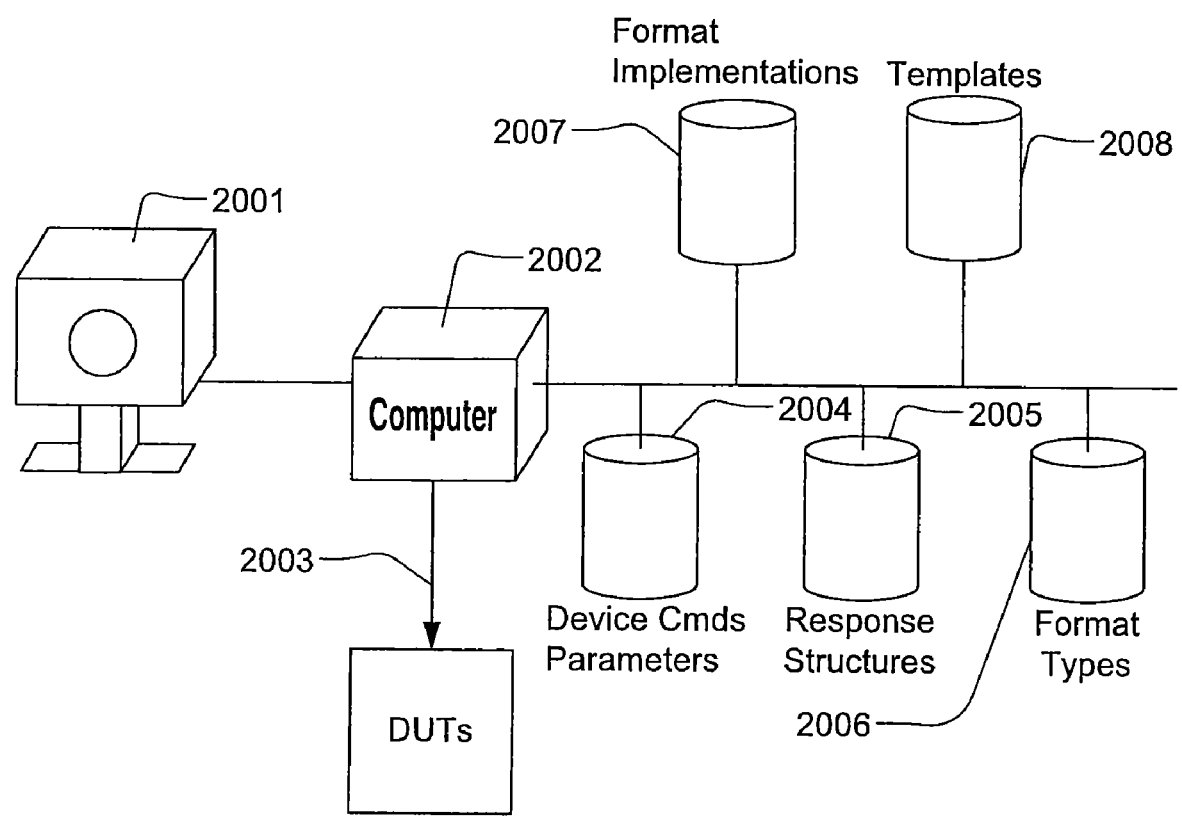
FIG. 20 shows one physical embodiment of the apparatus.

As illustrated in FIG. 20, one embodiment of an interactive device response template generation process provides a unified user interface 2001, a computer 2002, interface to devices under test, 2003 storage for device commands and the parameters required 2004, storage for response structures and substructures 2005, storage for available response format types 2006, storage for implementations of those format types 2007, and storage for the resultant response templates 2008.

FIG. 8 shows an embodiment of the initial screen that might be seen by a user. In this embodiment, the user may select the "New" button 801 to initiate a template session, the "Open" button 802 to open and edit an existing template, or the "Exit" button 803 to end the session. In another embodiment, a user can execute a command from a command line interface to initiate a template session given the template name or some setting to show this is a new template.

Figure 9:
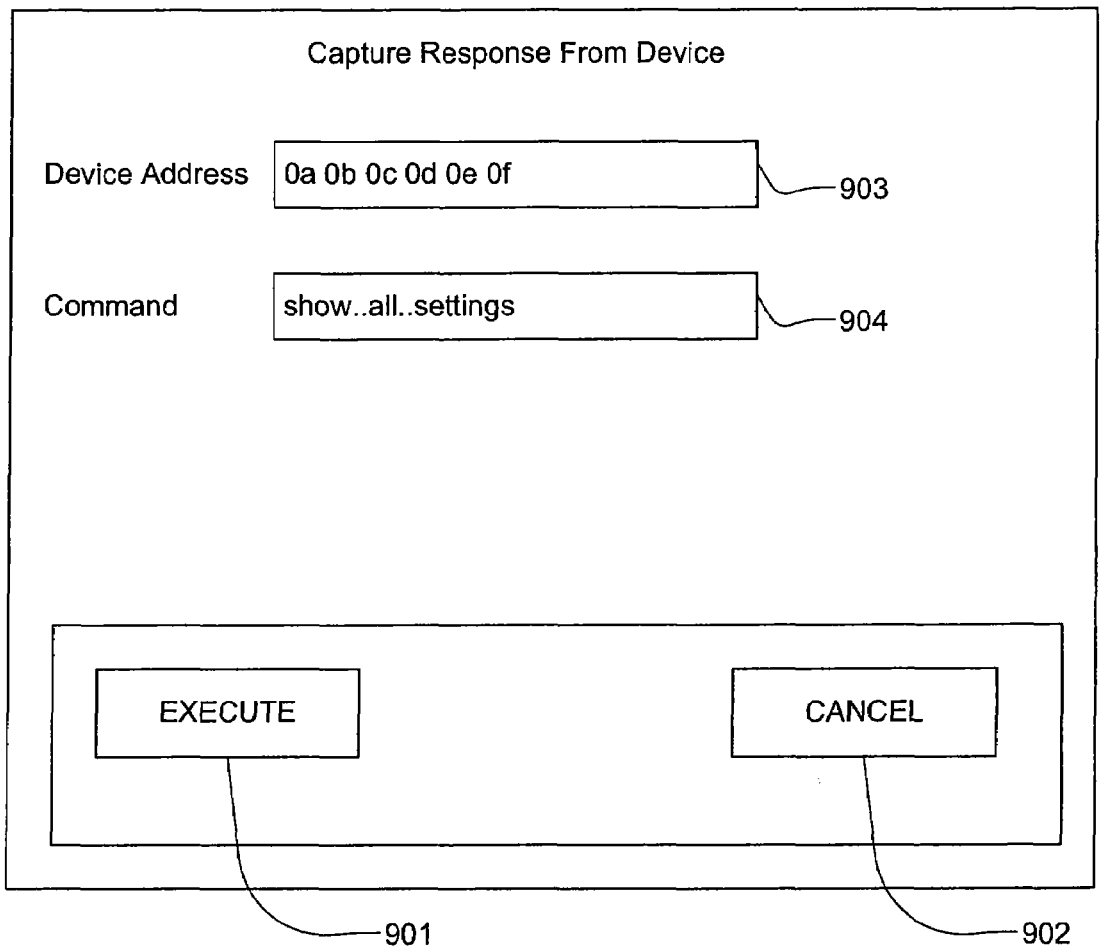
FIG. 9 illustrates an example of the template initiation display

Once the user decides to start a new template session, a display such as in FIG. 9 would be shown. The display shows the data entry fields for the device address 903 and the command to be sent to the device 904. Once these fields are entered, the user would either hit the "Execute" button 901 to cause the command to be sent to the device, or the "Cancel" button 902 if the user wishes to exit the template without creating it.

Figure 10:
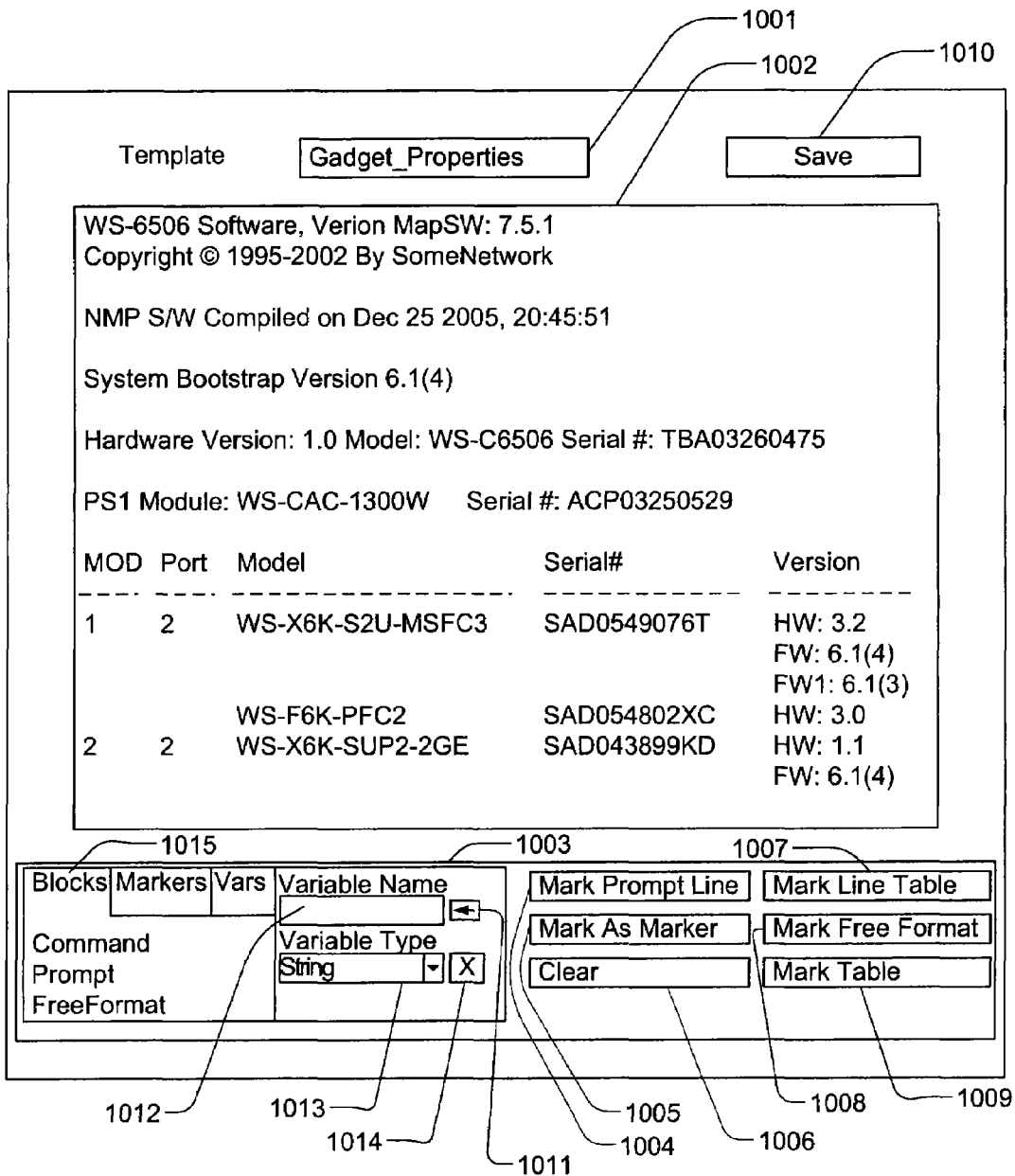
FIG. 10 shows an example of the template screen after the response was captured ready for patternization.

After executing the command, the resulting response is captured and a display similar to that of FIG. 10 would be presented to the user. It is presumed that the software controlling the command capture knows the characteristics of the device such that it knows the display length of the line and will process it accordingly. At this point, the user can associate blocks, markers, and variables with the template. Prior to saving the template by selecting the "Save" Button, the user would enter the name of the template 1001.

The process of patternizing the template involves the selection of text in the captured response area 1002, followed by selecting a block or field type as displayed in the button area 1003. At that point, the software will associate the selection text region with the type selected and, upon selecting to store this template, will be made available during test to either validate the use of the template with the device response, locate a variable within the response, or return the value of the variation within the response.

When an area selected in the captured response area is to be used for validating the screen, the "Mark Prompt Line" button is selected 1004. The value of the prompt line is then stored and associated with that template, such that after the template is saved it can be used to validate that the return value during the test is one that this template can be used with.

When an area selected in the captured response area is to be used to mark the location of a variable within a free format region, the "Mark as Marker" button is selected 1005. The location of the last character of the marker is used to mark the end of text on the line and it is assumed that the next non-whitespace value after that is a variable.

When one wishes to remove a selected region from the template, the "Clear" button is selected 1006. Once an area or subregion is removed, any information about that region or subregion will not be stored with the template and so any variables associated directly or indirectly with that region will not be accessible.

When an area selected in the captured response area is to be used as a line table, the "Mark Line Table" button is selected 1007. A line table is a table which consists of a header and a single row of data, which may extend to multiple lines. See FIG. 16 for an example of this 1601. The line table contains a single value of multiple variables (one per column) that can be used by selecting the column and entering a variable name and type to associate with it. The value can then be provided in a test step if queried for by variable name.

When an area selected in the captured response area is to be used as a free format region, the "Mark Free Format" button is selected 1008. The free format region enables one to select an area of text that has no form or format except to consist of contiguous characters. One can then define markers in the free format region to allow a test step to locate a variable value in the free format region.

Figure 14:
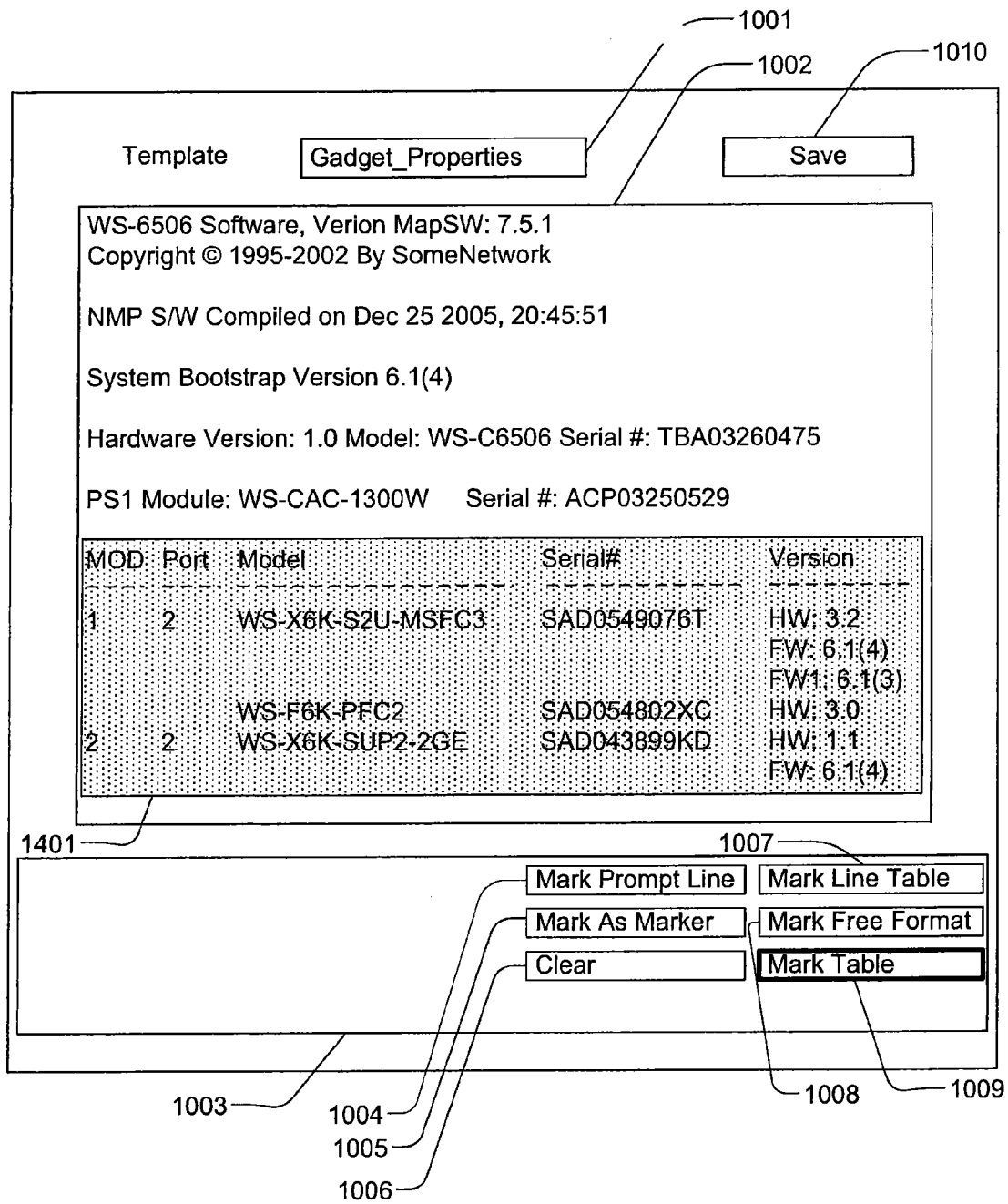
FIG. 14 shows an example of defining a selection of a table.

When an area selected in the captured response area is to be used as a table, the "Mark Table" button is selected 1009. The table consists of a header and one or more rows of data. The table enables one to return data based on any of a variety of queries that would be applicable to a table structure, such as a value in the second row associated with a specific column or a value in one column in the same row as a specific value for an item in another column. This can be enabled either by associating the value with a variable. For example, as illustrated in FIG. 14, the table area 1401 contains a column called 'MOD'. A query variable may be created for retrieving value of column 'serial #' by storing a query filter with the variable to be created to retrieve a particular value in the column 'serial #' by associating a query (such as 'get value of serial# where value of MOD=2'). It can also be done by enabling a structure called a dynamic variable in the runtime request from the test step that can search the table to retain the value. The value of dynamic variable is provided either by the user or from the output of another running testing scenario, at the runtime.

Note that the application should show the different regions using some sort of physical queues in order to allow one to select the proper area. On completion of processing a template, the "Save" button can be selected to store the completed template or template-in-progress.

Managing Template Storage

In one embodiment, the templates are stored in the computer file system. Because the template is created in the form of a portable document, it can be stored in different types of storages, including databases, either locally or on a remote server.

Device under test and command, for which the template was created, information is associated with the template for the ease of browsing and searching a desired template.

Marking Text and Adding Variables

The desired data from a command response can be retrieved, through a process called patternization, and analyzed in different ways. Patternization is a process of selecting various regions or subregions within those regions to define variables, markers for variables, or strings for validating the response. Sections of the response can be selected as blocks, markers, prompts, or variables. A variable is defined in a template by mapping a name and format to a specific area in the command response and assigning a data type. Defining variables in the Response Template allows the user to retrieve specific values from the response of the command during run-time testing.

Blocks are regions of the display that contain other structures. The current definition includes tables, line tables, and free format areas, but can also include a web service response (html or xml marked up stream), binary formatted data, and any parsable string of bytes. By adding new format types and appropriate substructures, the definition of a block can be expanded to include any data structure that can be represented to a user as a text stream. For instance, an html string is just a stream of characters such that it only makes sense to select specific subblocks; regions which start and stop with the same tag at the same level. Or, it is possible to represent a binary stream as a pair of hex values for each byte, making sure that one cannot define a region by splitting a byte; i.e must always start and stop on an even boundary. More complex binary structures would require more complex parsing, search and subregion definitions.

Blocks are marked and defined in the template before defining or creating variables to provide a marker because at run time or in successive command responses to the same command, the variable may not appear at the same location with respect to the start of the command response. Defining the blocks in which the variable appears provides a reference to parse the variable value.

Markers are strings that are used to align the search for a variable. It is assumed that the next non-whitespace value after the end of the marker is a variable.

Variables are named values of a specified format that are accessible to a test program assuming that this template is associated with that test step and the desired response is received as verified by one or more prompt lines.

Figure 11:
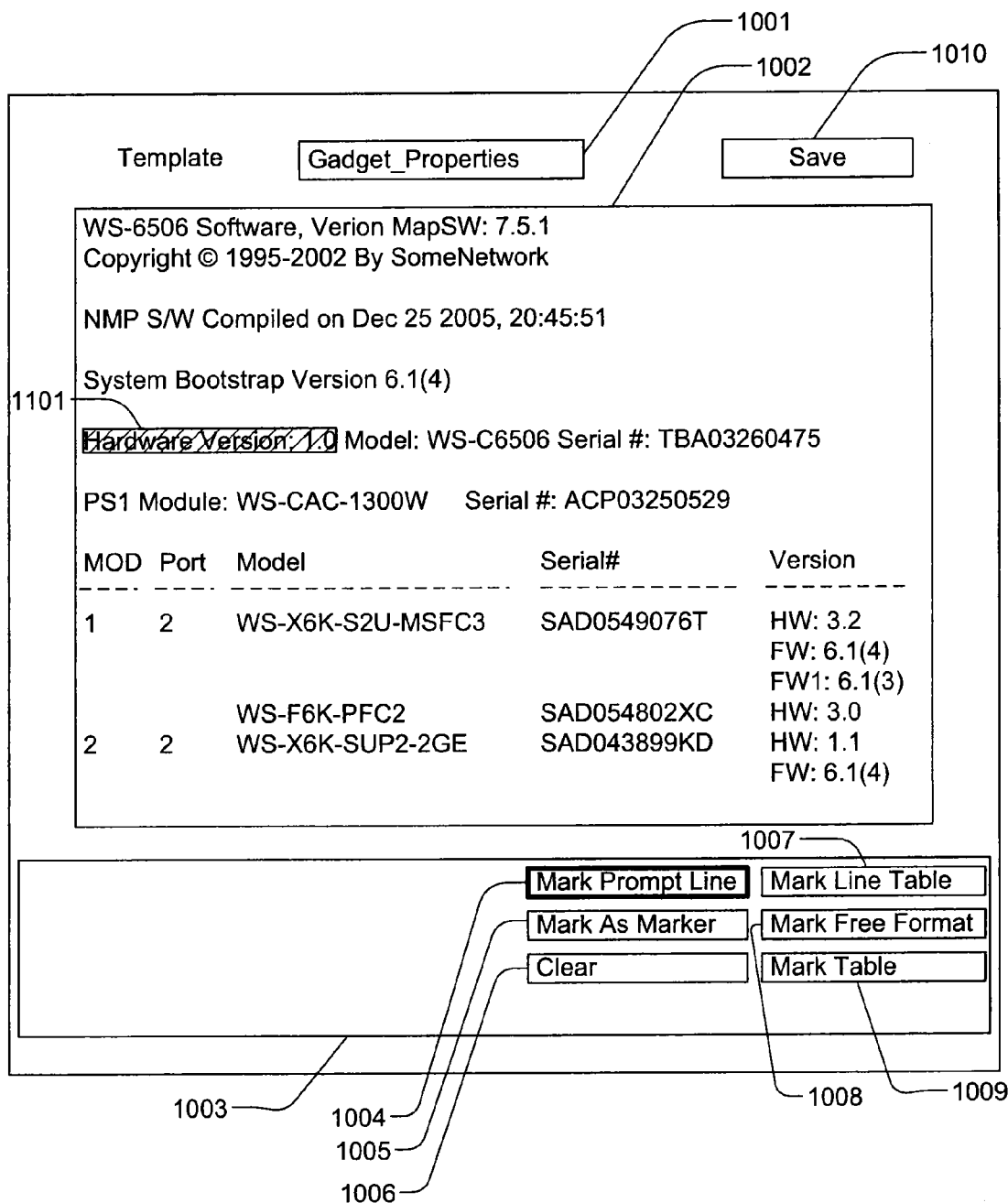
FIG. 11 shows an example of selecting a prompt line.

As shown on FIG. 11, the "Mark Prompt Line" button 1004 would be enabled when a single line or part of a single line is selected 1101. The resulting prompt line is assumed to be fixed text and can be used by the test software receiving the response to validate that the response returned can be analyzed using the template.

Figure 12:
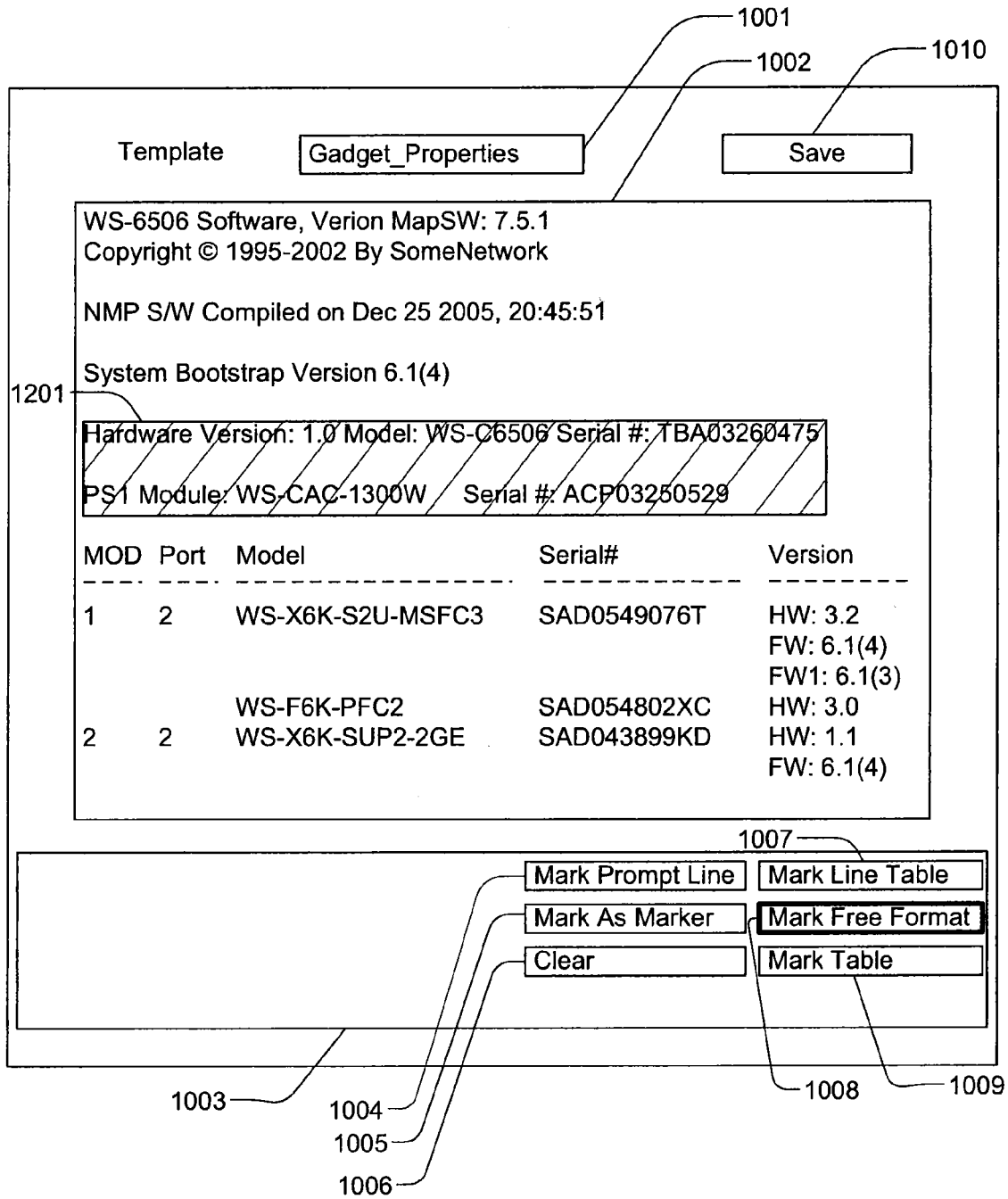
FIG. 12 shows an example of defining a free format region.
Figure 13:
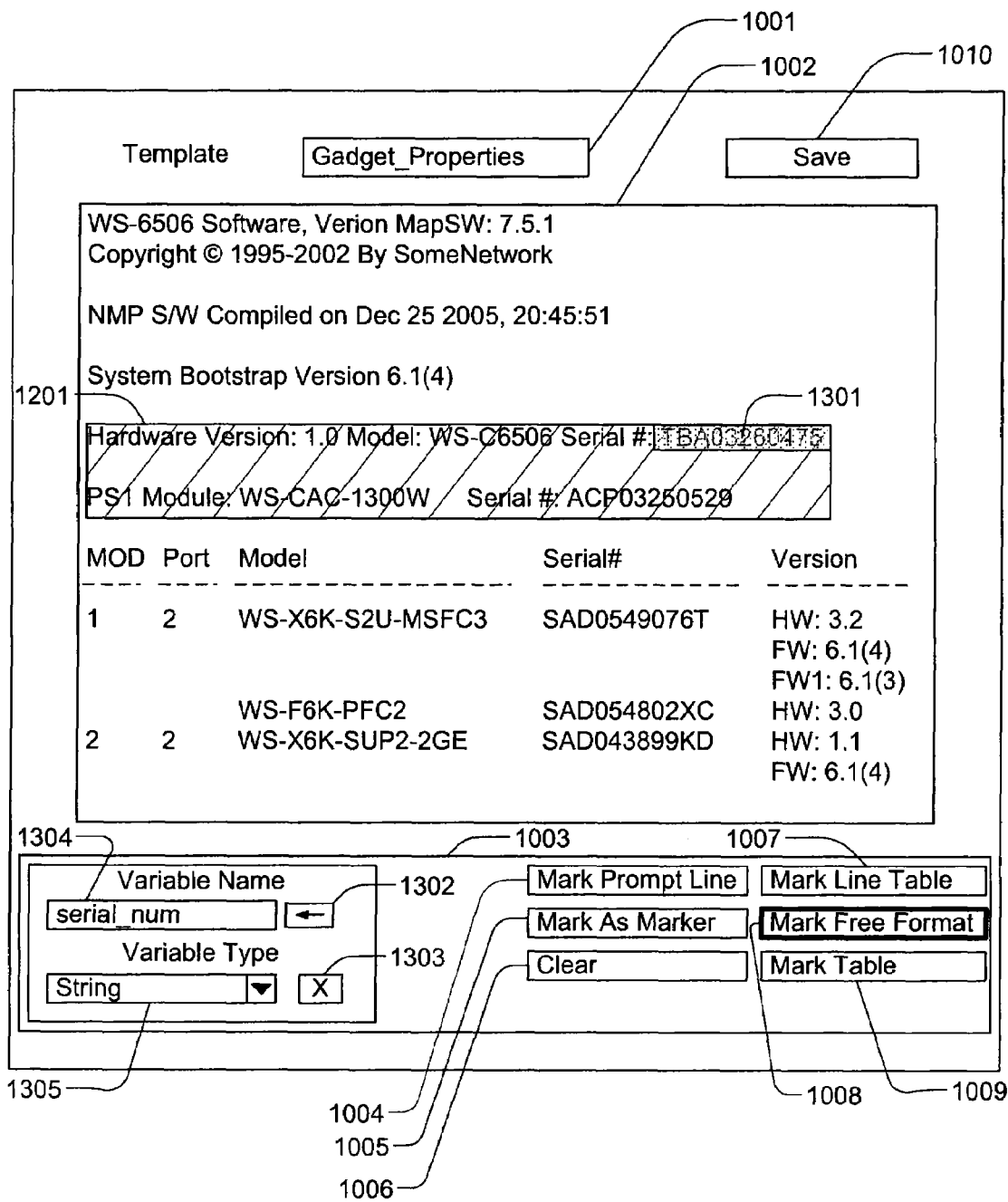
FIG. 13 shows an example of defining a variable in a free format region.

As shown in FIG. 12, "Free Format" is marked by selecting a region 1201 and selecting the "Mark Free Format" button 1008. To add a variable from a free format block, as illustrated in FIG. 13, highlight the exact space in which the value of the variable is most likely to appear. For example, if a 4 letter value is expected for a particular variable, select 4 spaces. Then enter the name of the variable in the variable name field 1304 and select an appropriate data type in the variable type 1305. Select the enter button 1302 to add the variable and the variable is created and stored in the template. If the user decides not to create the variable, use the cancel button 1303 to clear it.

Figure 21:
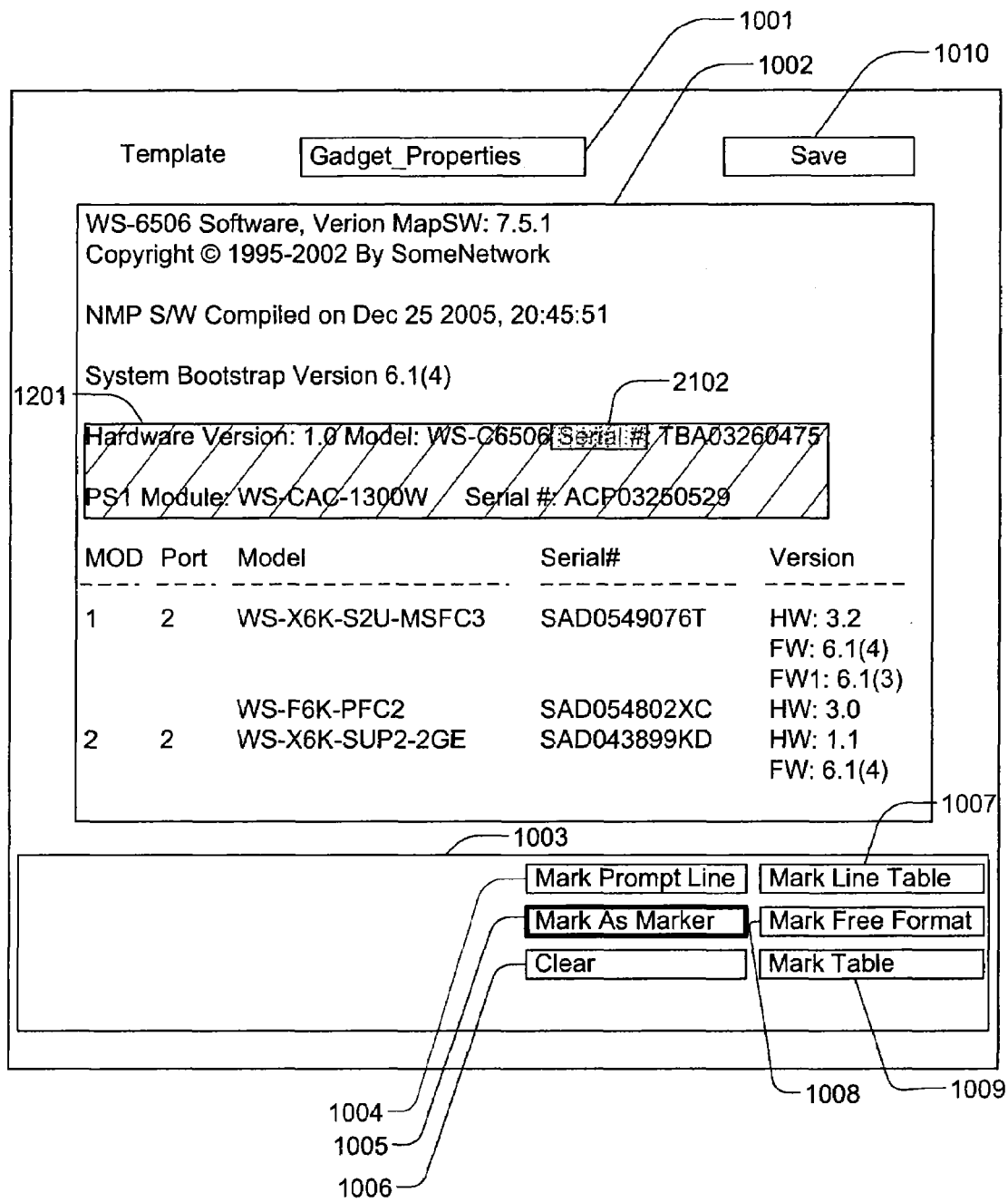
FIG. 21 shows the act of defining a marker for a free format region.

As shown in FIG. 21, the "Mark As Marker" button 1005 would be enabled when a single line or part of a single line is selected within a free format region. The resulting marker is used to define the region of the display where a variable can be found. For instance, in 1002, the string "serial #:" can be used to mark the beginning of a serial number 2102. The software on the response then could find the string "serial #:" then look for the first string after that after any white space found, and that would be a variable.

Figure 16:
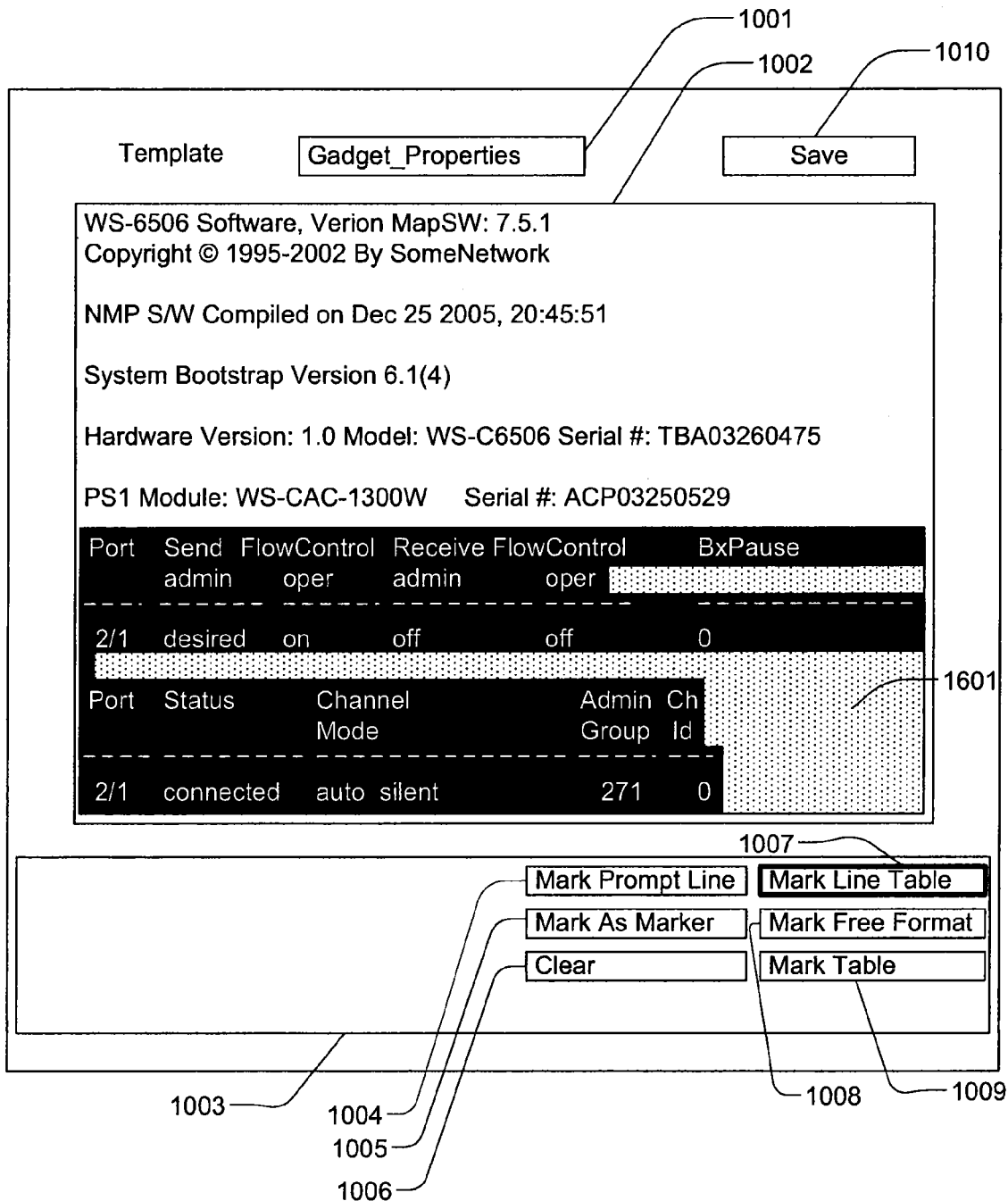
FIG. 16 shows an example of a column being defined in a table.

As shown in FIG. 16, a "Mark Line Table" is a special type of table which contains only one row of data and a table header. The row may be displaced in multiple rows and the row may have more fields than can be displayed on one line. In order to select the line table, a desired area on the console 1002 is selected and the "Mark Line Table" button 1007 is clicked. The selected block 1601 encompasses both names of the variables and values.

Figure 17A:
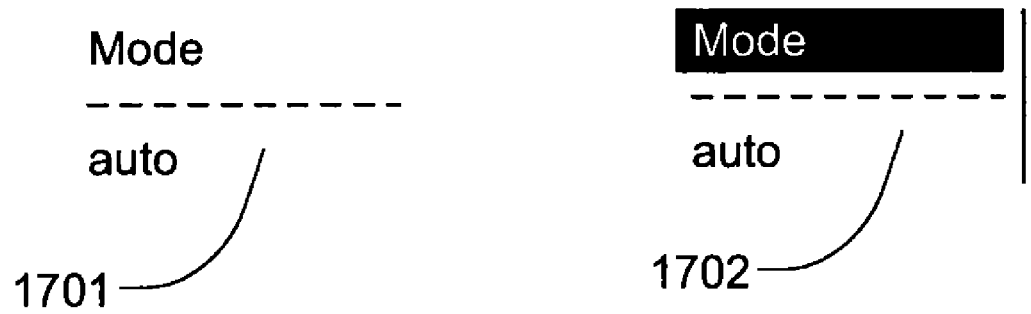
FIGS. 17a and 17b shows an example of a variable being defined in a table and free form area respectively.
Figure 17B:
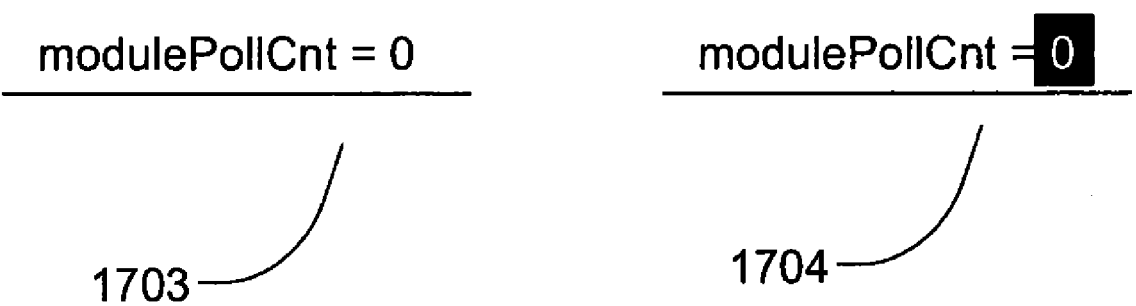

FIG. 17a illustrates unmarked 1701 and marked 1702 Line Table variable. To add a variable from a Line Table, highlight name of the variable (ex: variable 'mode' in FIG. 17a) extending the marking to the entire area under which the variable value is most likely to appear. This length of marking is to be used to store the maximum length of the variable value. Enter the name of the variable and select an appropriate data type and click the button to add the variable. The variable is created and stored in the template. Similarly, FIG. 17b illustrates adding a variable from a free format region. A subregion 1703 in a free format block may contain a variable which may be added to the template by selecting the value as being displayed 1704 on the console including the surrounding white spaces where the value of the said variable is most likely to appear. This length of marking is to be used to store the maximum length of the variable value. Enter the name of the variable and select an appropriate data type and click the button to add the variable. The variable is created and stored in the template.

Figure 19:
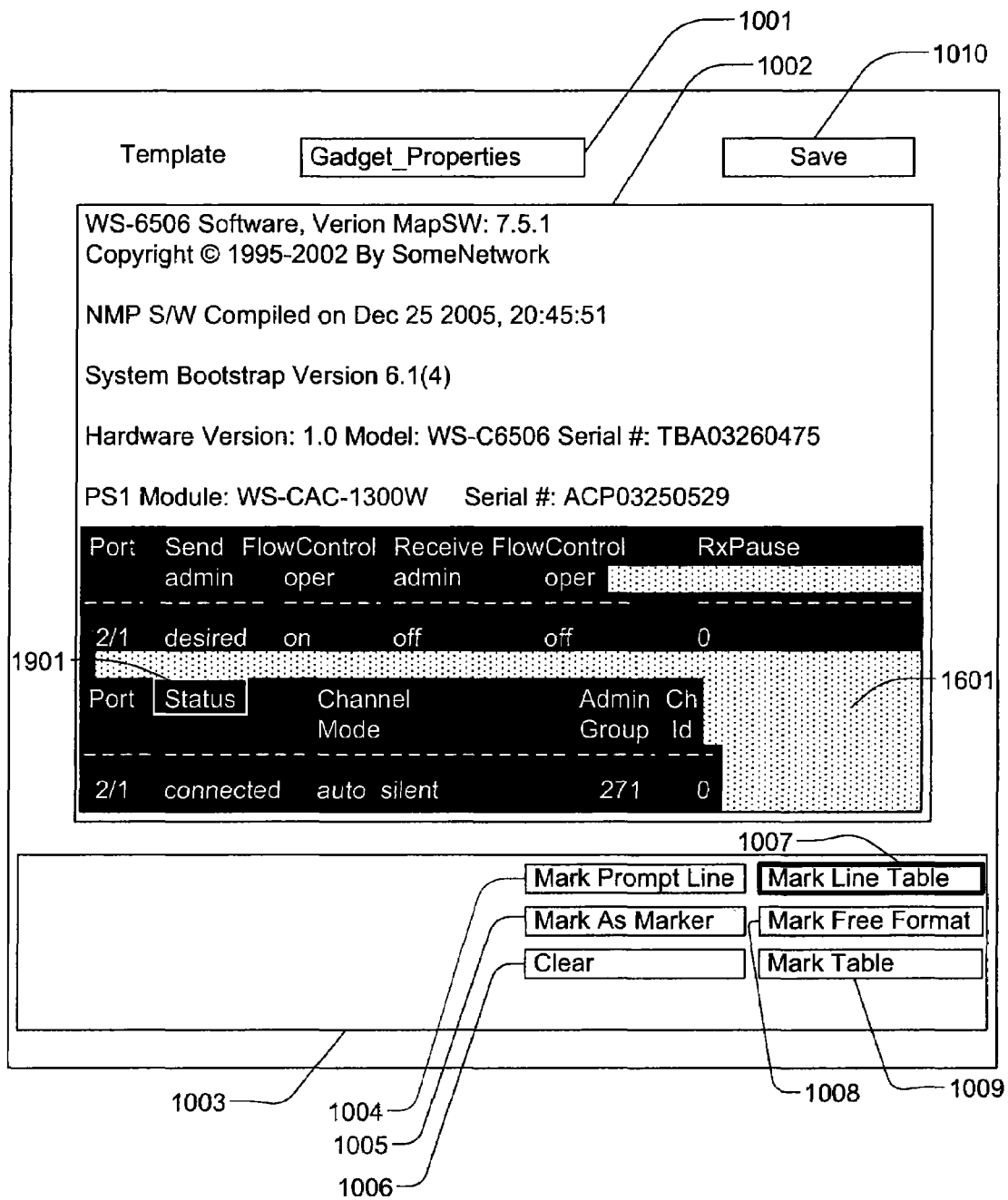
FIG. 19 shows an example of a variable being selected in a line table.

FIG. 19 shows this in context, where the line table 1601 has a variable status selected 1901.

The current value of a variable, as contained in the captured response area 1002, is displayed under the caption "current value" when an existing variable is selected.

Figure 15:
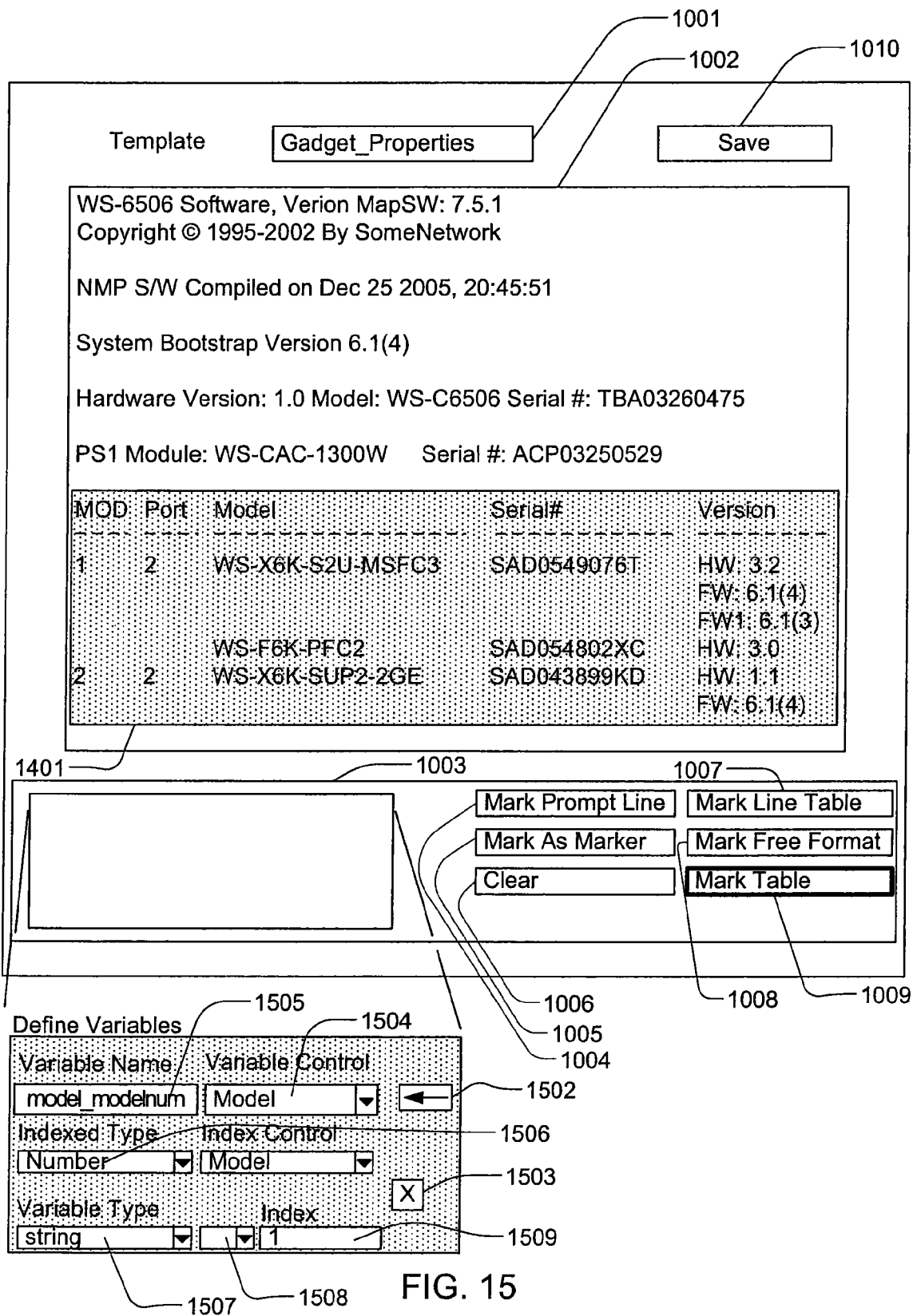
FIG. 15 shows an example of a table header being selected.

After creating or defining a Table Area, table columns are defined. To define a table column, highlight 1801 the column header. Extend the marking to the entire area under which the variable value is most likely to appear. This length of marking is to be used to store the maximum length of the variable value. Click on "Mark Table Header" button. The column header name is used as a default variable name for the column header. A new name may be given. For example, to create a variable Vlan0 to store the value of the first row of the Vlan column, as illustrated in FIG. 15, type Vlan0 in the "Variable Name" box 1505, select Vlan from the "Variable Column" box 1504, select "Number" from the "Index" box 1506 and type 0 in the "Index" box 1509. To create a variable VirtualMACVlan10 that will store the value of the Virtual MAC column on the same row with a value of 10 in the Vlan column, type VirtualMACVlan10 in the Variable Name box 1505, select VirtualMAC from the Variable Column box 1504, select Column Value from the Index Type 1506, select Vlan from the Index Column 1510, select String from the Variable Type box 1504, and type 10 in the Index box 1509. This process is repeated for other table headers.

One may select multiple values from a column of a table by entering a variable definition that defines separate variables referencing each value. So for instance, in the selected table in FIG. 13, one could create a variable called Mod1Serial to get the serial # where index type is value index column is MOD, variable type is String and Index is 1. Then create a variable called Mod2Serial to get the serial # where index type is value index column is MOD, variable type is String and Index is 2. For this example output, Mod1Serial would return the value SAD0549076T and Mod2Serial would return the value SAD043899 KD.

One could also create a dynamic variable during test that returns a value associated with a column based on a value defined previously in the test from another column. So a dynamic variable ModSerial which defines the MOD value and returns the serial # would return SAD0549076T for a MOD value of 1 and SAD043899 KD for a MOD value of 2.

On completion of the Template, the "Save" button would be pushed. In one embodiment, the template is stored in a database, in a format that captures the relationships between the blocks, markers, and variables, such as XML. However, it may be understood by a person skilled in the art that the template may also be converted in a different type of format and can be stored in other type of storage. After storing the template the user would be returned to the screen shown in FIG. 8. Another embodiment would be to include a separate "Exit" button to leave the display, and the "Save" button would simply update the stored version of the template.

FIG. 6 shows a sample response to a command as stored 600. Note that the start of a line is coded as "[n1" so it can be stored in a single entry and restored as required, preserving line breaks from the actual response. It should be noted that it may be understood to a person skilled in the art that "[n1" is simply a marker and other characters may be used in stead.

FIG. 7 shows a template derived from this sample response formatted as an XML string. It contains header information, one or more marker (m) in a list of markers (mlist), one or more blocks (b) in a list of blocks (blist), and one or more variables (v) in a variable list (vlist). The header information gives the software enough information to restore it. In this case, a version number and data type will enable the software to load the proper version of the code to interpret it.

It should be noted that it may be understood to a person skilled in the art that protocols and formats other than XML can also be employed to store or persist variables and template.

The user interface also provides retrieval of stored templates. The user interface also enables the user to select a desired template and run desired testing scenario. The device response from the DUT is parsed according to the variable definitions stored in the device template and the user is enabled to see the value of a desired variable. The list of all the variables in the template is displayed to the user on demand. User may make a selection of one or more variables to see the value of the variable. User may also see a list of other running test scenarios and chose to send values of desired variables to these other running scenarios.

What is claimed is:

1. A method for generating a device response template at a testing device relative to a device under test (DUT) communicatively linked thereto, comprising:
   sending a command to the DUT from the testing device;
   receiving the command response at the testing device from the DUT, the command response including a plurality of parameters;
   patternizing the command response, including,
      defining a parameter pattern within the plurality of parameters in the command response;
      assigning a type to the pattern;
      creating, in an electronic memory of the testing device, a device response template including a location of the pattern within the plurality of parameters, to identify the pattern in subsequent device testing.

2. The method of claim 1, wherein the patternizing further comprises:
   selecting a sub region in the pattern;
   creating a variable corresponding to the sub region;
   associating a data type to the variable; and
   storing the variable into the device response template.

3. The method of claim 1 wherein the parameter pattern is a free format.

4. The method of claim 1 wherein the parameter pattern is a table area.

5. The method of claim 4 further comprising:
   providing a data query interface at the testing device configured to identify a value of a table variable of the table area in accordance with a further table variable of a same row.

6. The method of claim 1 wherein the parameter pattern is a marker.

7. The method of claim 1 wherein the parameter pattern is a prompt line.

8. The method of claim 1 wherein the parameter pattern is a line table.

9. The method of claim 1 wherein the parameter pattern is binary data represented by 2 hexadecimal characters per byte.

10. The method of claim 1 wherein the parameter pattern is in structured text format.

11. A method of analyzing a device under test (DUT) at a testing device in accordance with a first testing scenario for the DUT, comprising:
   retrieving a device response template for said DUT from an electronic data storage operably linked to the testing device, the device response template including a location of a pattern of parameters within a plurality of parameters, the pattern including information defining dimensions of the pattern;
   executing the first testing scenario in accordance with the device response template;
   receiving a device response from the DUT;
   parsing the device response using device response template, the parsing including capturing parameters within the dimensions of the pattern; and identifying variable values in correspondence to the captured parameters through parsing.

12. The method of claim 11, further comprising:

executing a second testing scenario for the DUT;

providing the variable values of the first testing scenario to the second test scenario, the second test scenario being implemented by, reading a second device response template from the electronic data storage, the second device response template including a location of a further pattern of parameters within a plurality of parameters, the further pattern including information defining dimensions of the further pattern;

providing the variable values from first testing scenario to the second device response template;

executing the second testing scenario in accordance with the second device response template;

receiving a second device response at the testing device from the DUT;

parsing the second device response using the second device response template, the parsing including, capturing parameters within the dimensions of the further pattern; and identifying variable values in correspondence to the captured parameters through parsing.

13. The method as recited in claim 12 wherein the first testing scenario and the second testing scenario are a part of a device test suite.

14. A computer readable storage medium encoded with computer program instructions which cause a computer to execute a method of generating a device response template at a testing device relative to a device under test (DUT), comprising:

sending a command to the DUT from the testing device;

receiving the command response at the testing device from the DUT, the command response including a plurality of parameters;

patternizing the command response, including, defining a parameter pattern within the plurality of parameters in the command response;

assigning a type to the pattern;

creating in an electronic memory of the testing device, a device response template including a location of the pattern within the plurality of parameters, to identify the pattern in subsequent device testing.

15. A testing device for generating a device response template relative to a device under test (DUT) operably linked to the testing device via a network, comprising:

a data processor configured with an instruction set to generate a device response template and to perform subsequent testing of the device under test in accordance with the device response template;

a network interface, responsive to the data processor to send a command to the DUT from the testing device;

a graphical user interface, responsive to the data processor to present a command response received from the DUT in response to the command, the command response including a plurality of parameters, the graphical user interface presenting the command response and including a menu to identify a pattern within the plurality of parameters, the menu configured to define a pattern type and to designate sub-portions of the identified pattern as predetermined parameters;

wherein the data processor receives pattern type assignments and designated sub-portions, and creates in an electronic memory of the testing device, a device response template including a location of the pattern and location of the designated sub-portions, within the plurality of parameters, for subsequent device testing.

* * * * *